United States Patent
Qiu et al.

(10) Patent No.: US 6,411,017 B1
(45) Date of Patent: Jun. 25, 2002

(54) PIEZOELECTRIC DEVICE, INK JET RECORDING HEAD, AND METHODS OF MANUFACTURING SAID DEVICE AND HEAD

(75) Inventors: Hong Qiu; Kouji Sumi; Tsutomu Nishikawa; Souichi Moriya, all of Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/296,279

(22) Filed: Apr. 22, 1999

(30) Foreign Application Priority Data

Apr. 24, 1998 (JP) .......................................... 10-115099

(51) Int. Cl.⁷ .............................................. H01L 41/08
(52) U.S. Cl. ........................................ 310/358; 310/324
(58) Field of Search ................. 310/357–359, 310/328, 324, 311

(56) References Cited

U.S. PATENT DOCUMENTS

| | | | | |
|---|---|---|---|---|
| 4,677,336 A | * | 6/1987 | Kushida et al. | 310/358 X |
| 5,142,186 A | * | 8/1992 | Cross et al. | 310/358 X |
| 5,198,269 A | | 3/1993 | Swartz et al. | 427/226 |
| 5,265,315 A | | 11/1993 | Hoisington et al. | 29/25.35 |
| 5,691,752 A | * | 11/1997 | Moynihan et al. | 310/358 X |
| 5,825,121 A | * | 10/1998 | Shimada | 310/358 |
| 5,994,822 A | * | 11/1999 | Kondo et al. | 310/358 |
| 5,998,910 A | * | 12/1999 | Park et al. | 310/358 |
| 6,013,970 A | * | 1/2000 | Nishiwaki et al. | 310/358 X |
| 6,051,914 A | * | 4/2000 | Nishiwaki | 310/358 |
| 6,097,133 A | * | 8/2000 | Shimada et al. | 310/358 |
| 6,140,746 A | * | 10/2000 | Miyashita | 310/358 |

FOREIGN PATENT DOCUMENTS

| | | |
|---|---|---|
| EP | 0 513 478 A2 | 11/1992 |
| EP | 0 764 992 A1 | 3/1997 |
| JP | H3-69512 | 3/1991 |

OTHER PUBLICATIONS

Kumar et al., "Lead Zirconate Titanate Films by Rapid Thermal Processing," Appl. Phys. Lett., vol. 58 (11), Mar. 18, 1991, pp. 1161–1163.

K. Tadaaki, Piezoelectric Ceramic Thin–Film Device, Patent Abstracts of Japan, Pub. No. 10–215008, Aug. 8, 1998.

S. Okuma, Piezoelectric Element and its Manufacture, Patent Abstracts of Japan, Pub. No. 04–340429, Nov. 26, 1992.

* cited by examiner

Primary Examiner—Mark O. Budd
(74) Attorney, Agent, or Firm—Sterne, Kessler, Goldstein & Fox P.L.L.C.

(57) ABSTRACT

A piezoelectric device having a crystallized piezoelectric film between a lower and an upper electrode, wherein the crystal axis of the columnar crystal grain with the (001) orientation in the crystal forming the piezoelectric film is inclined by a predetermined angle relative to the normal direction of the lower electrode face, thereby improving the electric/mechanic converting function under low voltage conditions.

8 Claims, 9 Drawing Sheets

PIEZOELECTRIC DEVICE, INK JET RECORDING HEAD, AND METHODS OF MANUFACTURING SAID DEVICE AND HEAD

BACKGROUND OF THE INVENTION.

1. Field of the Invention

The present invention relates to a piezoelectric device having a function of converting electric energy into mechanic energy (hereinafter "electric/mechanic converting function"), and particularly to a piezoelectric device with improved piezoelectric properties by setting the crystallographic axes of a specific crystal in the piezoelectric device to specific conditions.

2. Description of the Related Art

A piezoelectric device has a piezoelectric film between two electrodes. Lead zirconate titanate (PZT) or other piezoelectric ceramics are used for the piezoelectric film. These materials, which are indicated by the chemical formula $ABO_3$, are known to build a perovskite crystal structure, and this crystal structure has an electric/mechanic converting function.

Figure 6:
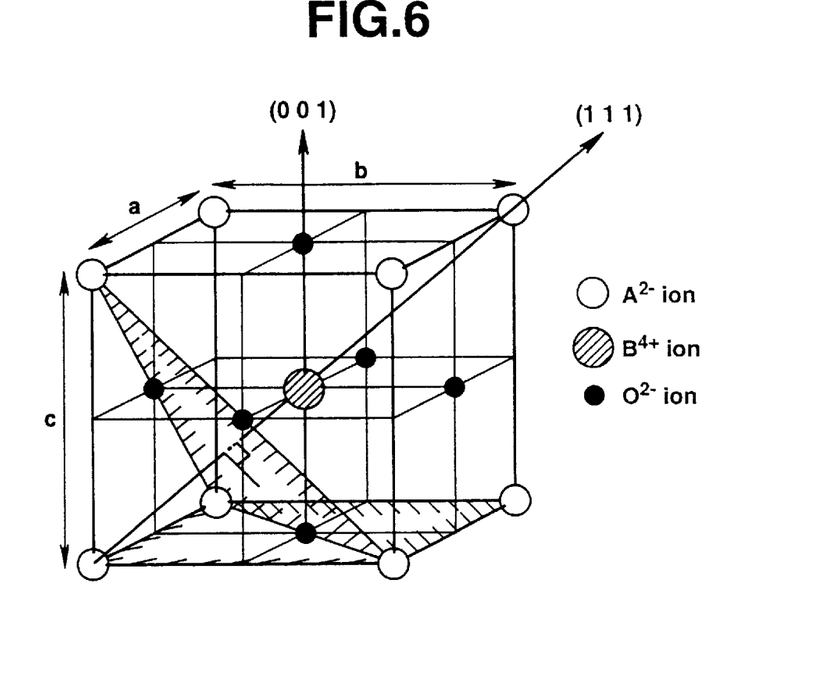
FIG. 6 illustrates the perovskite structure of a tetragonal system and the crystallographic axes.

FIG. 6 illustrates the perovskite crystal structure of a unit cell in the piezoelectric ceramics having the above composition. As stated above, this structural figure is expressed by the chemical formula $ABO_3$. As an example, if the piezoelectric ceramics is PZT, A may be $Pb^{2+}$, B may be $Zr^{4+}$ or $Ti^{4+}$, and O may be $O^{2-}$. If the piezoelectric ceramics is PZT-PMN, $Mg^{2+}$ or $Nb^{5+}$ is substituted for the atom B. The orientation of crystal grains is often specified relative to crystal planes.

Crystals are divided into several crystal systems. In any system, the plane containing the apex of the crystal system can be specified through its crystallographic axes. The crystal is oriented in the normal direction of any one plane to which the crystal can be set. This normal vector is specified by the value of crystallographic axes for specifying the plane corresponding to this normal line. This orientation is called the crystal direction. Planes or orientations within crystals can be indicated by using the Miller indices. When defining primitive translational vectors such as a, b, c in FIG. 6 according to the Miller indices, the crystal oriented in the plane shown by slanted lines has a (001) plane (<001> orientation) and a (111) plane (<111> orientation). The polarization axis direction in piezoelectric films made of PZT or other tetragonal system has the (001) orientation, and that in a rhombohedral system has the (111) orientation.

An example of a piezoelectric device having this crystal structure is disclosed in. Patent Laid-Open Publication No. Hei 3(1990)-69512, and Applied Physics Letters, 1991, Vol. 58, No. 11, pp. 1161–1163. A prior art of an ink jet type recording head using said piezoelectric device is for example U.S. Ser. No. 5,265,315.

However, a conventional piezoelectric device had inferior electric/mechanic converting function, particularly under low voltage conditions. Especially in use with portable printers, there was the need for a piezoelectric device having high electric/mechanic converting function under low voltage conditions.

This electric/mechanic converting function is evaluated by the piezoelectric effect which is the relation between the electric polarization and the stress. The piezoelectric effect can be quantified by the product of a piezoelectric charge constant d, a piezoelectric voltage constant g and the dielectric constant. Here, the piezoelectric charge constant d is the proportional coefficient between the displacement and the electric field, and the piezoelectric voltage constant g is the proportional coefficient between the electric field and the stress. The dielectric constant is the proportional coefficient between the electric field and the planar density of electric charge. In conventional arts, the piezoelectric charge constant d was low when the applied voltage was low.

SUMMARY OF THE INVENTION

The inventors of the present invention have found that inclining the crystallographic axes influences the piezoelectric effect under low voltage. Thereupon, the inventors have manufactured a piezoelectric ceramics by intentionally inclining its crystallographic axes, thereby improving the electric/mechanic converting function under low voltage.

It is an object of the present invention to provide a piezoelectric device having good piezoelectric properties under low voltage by adjusting the crystallographic axes of the (001) plane.

It is a further object of the present invention to provide an ink jet recording head which can discharge ink under low voltage well by including a piezoelectric device having the crystallographic axes of the (001) plane.

It is another object of the present invention to provide a method of manufacturing a piezoelectric device having adjustable crystallographic axes of the (001) plane.

It is still another object of the present invention to provide a method of manufacturing an ink jet recording head having a piezoelectric device with adjusted crystallographic axes of the (001) plane.

To this end, the piezoelectric device according to the present invention includes a lower electrode, an upper electrode, and a crystallized piezoelectric film arranged between the lower electrode and the upper electrode, wherein the crystallographic axes (orientation) of the columnar grain with the (001) orientation of the crystal forming the piezoelectric film is inclined by a certain angle relative to the normal direction of the lower electrode face.

The angle formed by the crystallographic axis of the columnar grain with the (001) orientation and the normal direction of the lower electrode face may be 5 degrees or more and 20 degrees or less. The columnar grain with the (001) orientation includes an interface layer with 5 nm or less thickness in the vicinity of said lower electrode. As an alternative, the crystallographic axis of the columnar grain with the (001) orientation is parallel to the normal direction of the lower electrode face within a certain distance from the interface between the lower electrode and the crystal grain. At this time, the predetermined distance in which the crystallographic axis is parallel to the normal direction of the lower electrode face is within the range of 15 nm or less from the interface between the crystal grain and the lower electrode.

On the other hand, in the grains forming the piezoelectric film, the crystallographic axes of the columnar grains with the (111) orientation are substantially parallel to the normal direction of the lower electrode face. The columnar grain with the (001) orientation has a crystal grain with larger average grain size than the columnar grain with the (111) orientation.

Specifically, the piezoelectric film preferably contains piezoelectric ceramics which is any one of lead zirconate titanate (Pb(Zr, Ti)$O_3$:PZT), lanthanum lead titanate ((Pb, La)Ti$O_3$), lead lanthanum zirconate titanate ((Pb,La)(Zr,Ti)$O_3$:PLZT), and lead magnesium niobate zirconate titanate (Pb(Zr, Ti)(Mg,Nb)$O_3$:PZT-PMN).

The ink jet recording head according to the present invention includes a pressure chamber provided on a pressure chamber substrate, and a nozzle provided in the pressure chamber, wherein ink can be discharged from the nozzle by changing the volume of the pressure chamber, and volume change is caused in the pressure chamber by using the piezoelectric device according to the present invention as the drive means.

The method of manufacturing a piezoelectric device having an electric/mechanic converting function according to the present invention includes the step of using a sol with the piezoelectric ceramics adjusted to a mol concentration of 0.7 mol/1 to 1.5 mol/1 to form a piezoelectric film sandwiched between a lower electrode and an upper electrode.

The sol above may be generated by including polyethylene glycol in an amount of 0.15 mol or more to 0.5 mol or less relative to 1 mol of piezoelectric ceramics.

Also, during the step of forming the piezoelectric film, each of the thin layers is formed by a step of coating the sol at a predetermined thickness, and a step of drying and defatting such coated sol, and each time the thin layers are layered to a certain total number of layers, these layers are subjected to high-speed and high-temperature heat treatment to be crystallized.

The method of manufacturing an ink jet recording head according to the present invention, wherein volume change is caused in a pressure chamber provided in a pressure chamber substrate to enable ink to be discharged from a nozzle provided in the pressure chamber, includes the steps of forming an insulating film on the pressure chamber substrate, forming a piezoelectric device on said insulating film by the method according to the present invention, shaping the piezoelectric device to enable a change in volume to be caused inside the pressure chamber, and forming the pressure chamber on the pressure chamber substrate.

DESCRIPTION OF THE PREFERRED EMBODIMENTS

Now, modes of working the present invention will be described below with reference to the drawings. The embodiments relate to a piezoelectric device having a specific crystalline structure, an ink jet recording head using same, and the manufacturing method of such device and recording head. Particularly used are piezoelectric ceramics such as PZT.

Structure

Figure 1:
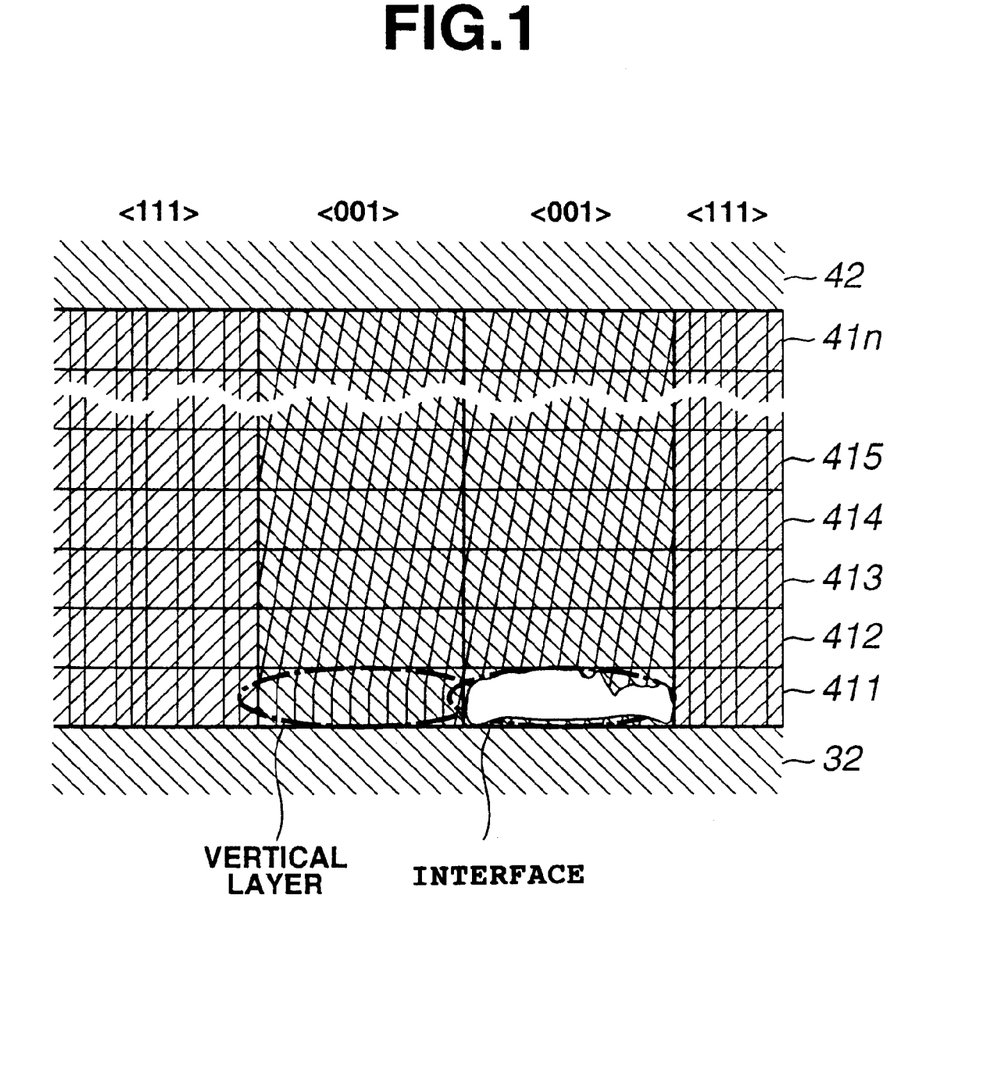
FIG. 1 is a cross section explaining the crystal structure of the piezoelectric film forming the piezoelectric device according to the present invention.

FIG. 1 is a cross section explaining the layered structure of the piezoelectric device according to one embodiment. As shown in FIG. 1, the piezoelectric device 40 has a piezoelectric film 41 having a plurality of thin layers 411–41 n (n is an arbitrary natural number, for example 8) between the lower electrode 32 and the upper electrode 42.

The lower electrode 32 is an electrode which forms a pair with the upper electrode 42 for applying voltage to the piezoelectric film 41, and is made by layering layers of conductive material, for example titanium (Ti), platinum (Pt) and titanium (Ti). Forming the lower electrode in this way by layering a plurality of layers functions to enhance the adhesion between the platinum layer and the piezoelectric film, and the platinum layer and the insulating film. The upper electrode film 42 forms one of the electrodes for applying voltage to the piezoelectric film 41, and is made of a conductive material, such as platinum (Pt), having a thickness of, for example, 0.1 $\mu$m. The material is not limited as long as it is conductive.

The piezoelectric film 41 is made of piezoelectric ceramics. The composition of the piezoelectric ceramics is preferably either lead zirconate titanate (Pb(Zr, Ti)$O_3$:PZT), lead lanthanum zirconate titanate ((Pb,La)(Zr,Ti)$O_3$:PLZT), or lead magnesium niobate zirconate titanate (Pb(Zr, Ti)(Mg, Nb)$O_3$:PZT-PMN). These piezoelectric ceramics have a large piezoelectric charge constant d, namely a high electric/mechanic converting function, and have characteristics suitable as the material for a piezoelectric device. For example, in the case of lead magnesium niobate zirconate titanate, a preferable composition is: (Pb(Zr$_{0.56}$ Ti$_{0.44}$)$_{0.9}$(Mg$_{1/3}$, Nb$_{2/3}$)$_{0.1}$O$_3$. However, the composition of this piezoelectric film may be any other composition sufficient to show electric/mechanic converting function.

Especially in the crystalline structure of the piezoelectric film 41 of the present embodiment, the crystal axis of the columnar grain with the (001) orientation is inclined at a certain angle in the normal direction of the lower electrode (equal to the direction of the electric field). In most cases, the specific angle of inclination is between 5 degrees and 20 degrees. In the columnar grain with the (001) orientation, the vertical layer or interface layer, whose electric constant is low, has grown at its interface with the lower electrode. The vertical layer is distributed between the range of 5m to 15 nm from the interface. The interface layer is distributed in the range of 5 nm from the interface. The vertical layer is a layer with the crystal axis parallel to the normal direction of the lower electrode, and the interface layer is a layer having lattice defect so the crystal lattice becomes irregular, thereby providing a low dielectric property.

Originally, during the crystal formation, the crystal should grow in the direction vertical to the electrode face from the Pt lower electrode. However, in the columnar grain with the (001) orientation, this vertical growth can be seen only in the vertical layer, and the crystal axis inclines. Also, by the working of stresses, a lattice defect arises and forms an interface layer.

This inclination of the crystal axis in the columnar grain with the (001) orientation is presumed to arise from the influence of stresses during the crystal growth process according to the manufacturing method of the present invention, so that the crystal axis is curved. In the columnar grain with the (111) orientation, this phenomenon does not appear, and the crystal axis is vertical to the face of the lower electrode. Furthermore, the crystal structure can be confirmed by taking cross sectional transmission electron microscopy (XTEM) photographs, etc., of the piezoelectric film.

The thickness of each of the thin layers 411-41n forming the above piezoelectric film 41 is formed to be 100 nm or more and 250 nm or less. If the layers are too thin, the number of steps required for layering becomes too large, and throughput cannot be achieved. If the layers are too thick, cracks tend to arise during the defatting or high-speed heat treatment.

The number of layered layers is preferably 2 to 8 layers. This number is determined by the relation with the thin layer above. In other words, whereas sufficient layers should be provided to ensure displacement of the piezoelectric device, too many layers will cause cracks in the piezoelectric film during the manufacturing process, or the drive voltage will become too high. The whole thickness of the piezoelectric film 41 is preferably approximately 500 nm to 2000 nm.

Furthermore, the lower electrode 32 and the upper electrode 42 need not necessarily form a plane, and they need not be parallel to each other. However, in case they form no plane and are not parallel, the crystal axis along the (001) orientation of the piezoelectric film should be formed to have the inclination described above relative to the direction of the electric field existing between both electrodes.

Figure 2:
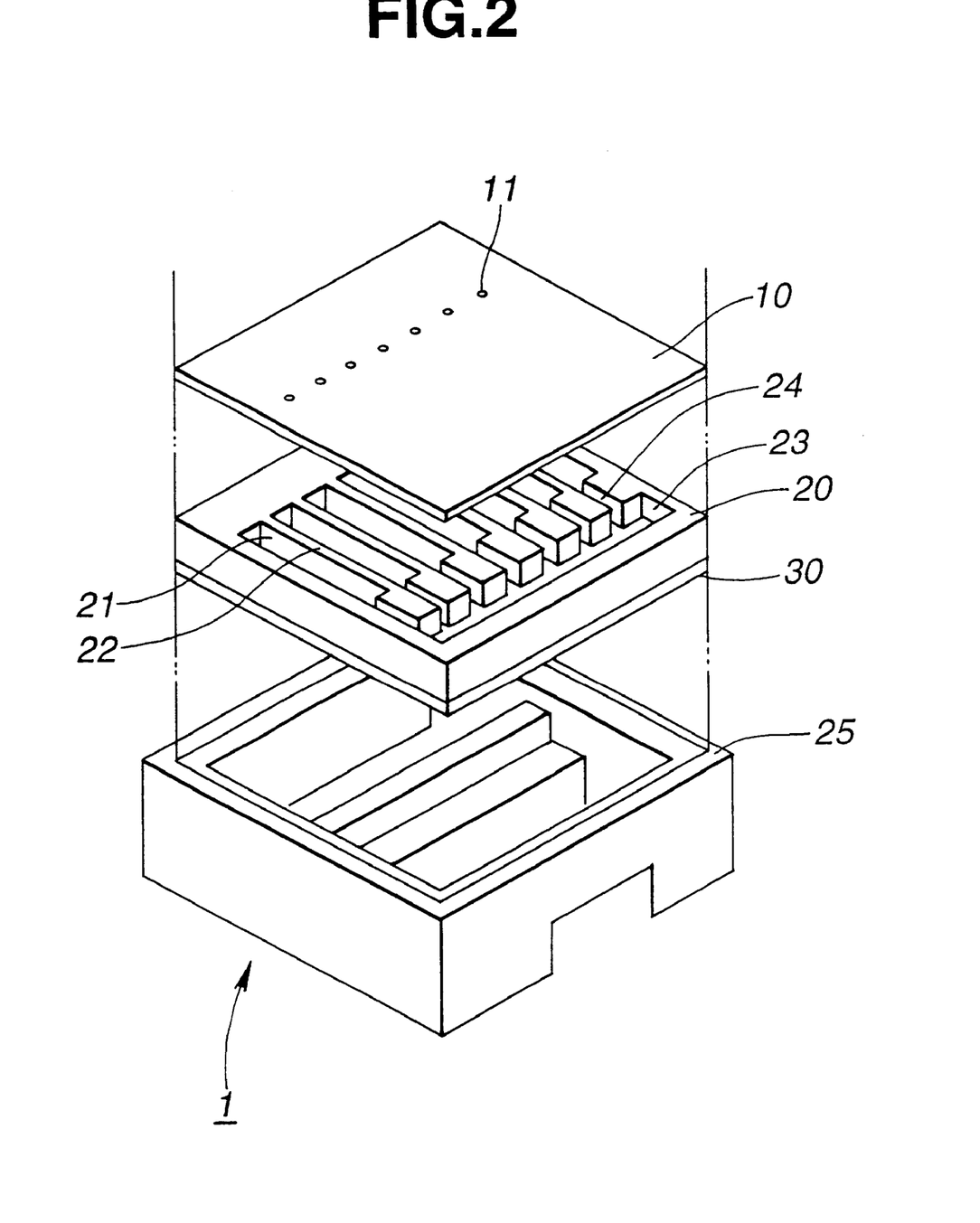
FIG. 2 is an exploded perspective view of the ink jet recording head according to the present invention.
Figure 3:
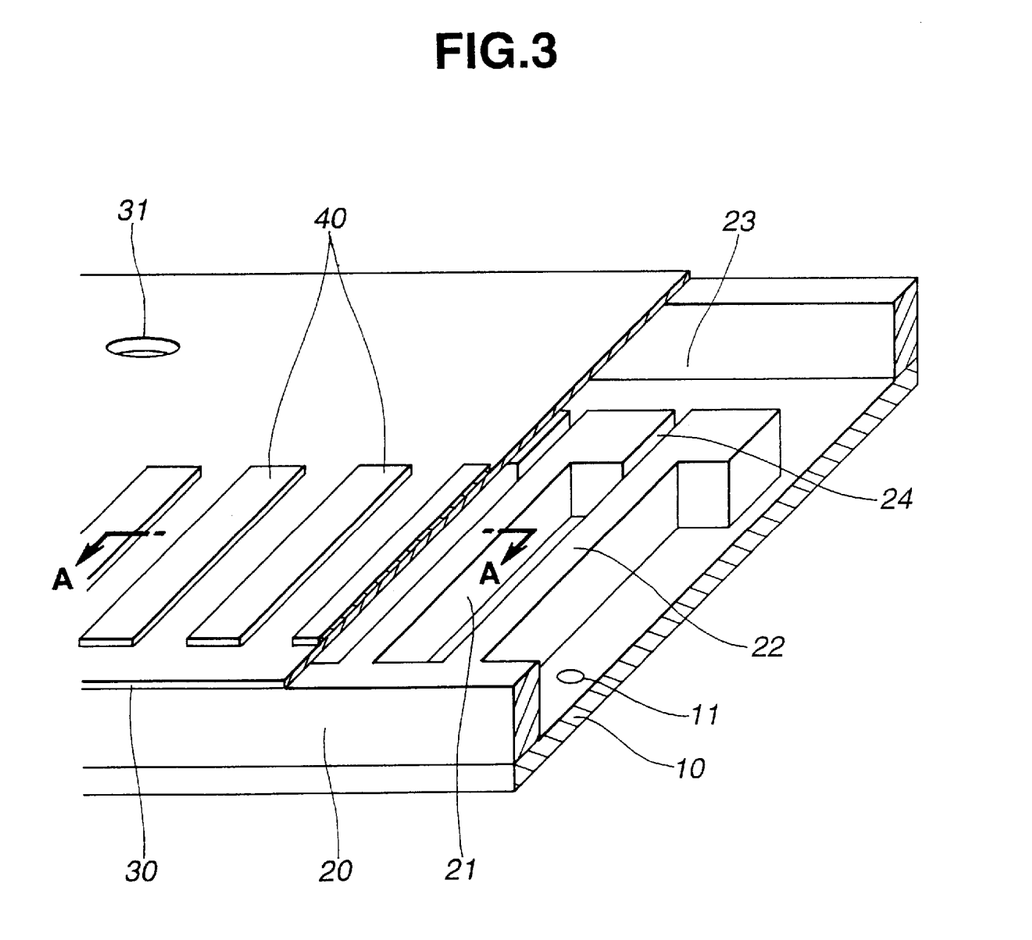
FIG. 3 is a perspective view with a partial cross section of the ink jet recording head according to the present invention.

FIG. 2 is an exploded perspective view of an ink jet recording head using the piezoelectric device 40 above. FIG. 3 is a partial cross section of the main portion of the ink jet recording head. As shown in FIG. 2, the ink jet recording head 1 includes a nozzle plate 10, a pressure chamber substrate 20, a vibrating plate 30 and a box-shaped body 25.

The pressure chamber substrate 20 is made by etching a silicon or quartz mono-crystalline substrate, and, as shown in FIG. 3, includes a cavity 21, a side wall 22, a reservoir 23 and a supply inlet 24. The cavity 21 is formed so as to be operatable as a pressure chamber for applying pressure to ink. The side wall (division wall) 22 is structured to separate the cavity 21, and the reservoir 23 is structured to supply ink into each cavity 21. The supply inlet 24 is structured to allow introduction of ink in each cavity 21. As a whole, an on-demand, piezo-jet type ink jet recording head is formed.

The vibrating plate 30 is structured so that it can be pasted to one face of the pressure chamber substrate 20. The vibrating plate 30 is provided with the piezoelectric device 40 according to the present invention. The piezoelectric device 40 is a piezoelectric crystal with perovskite structure, and is formed in a predetermined shape on the vibrating plate 30. Furthermore, in the present embodiment, the vibrating plate 30 is structured so the insulating film 31 and the lower electrode 32 are layered, but it is also possible to form the lower electrode 32 and the piezoelectric film 41 to the same shape and form the vibrating plate 30 only by the insulating film 31.

The nozzle plate 10 is pasted to the pressure chamber substrate 20 so the respective nozzle holes 11 ate arranged at positions corresponding to each of the plurality of cavities 21 provided on the pressure chamber substrate 20. The pressure chamber substrate 20 with the nozzle plate 10 pasted thereon is further fitted into the box-shaped body 25 as shown in FIG. 2 to form the ink jet recording head 1.

The insulating film 31 is made of non-conductive material such as silicon dioxide formed by heat-oxidizing a silicon monocrystal substrate, and structured to deform according to the change in volume of the piezoelectric film to instantaneously increase the inner pressure of the cavity 21.

Operation

According to the above structure, in the columnar grains with the (001) orientation of the piezoelectric film according to the present invention, the crystal axes mostly show a constant angle relative to the direction of the electric field. In the piezoelectric device having this structure, a high piezoelectric charge constant d arises particularly when low voltage is applied between the electrodes (cf. FIG. 12). The displacement achieved under appliance of 8V–12V in prior arts can be achieved by applying approximately 5V–7V with the piezoelectric device according to the present embodiment, causing a greater displacement than in prior arts within the range of 4V–17V. Accordingly, it is possible to discharge more ink by causing a larger displacement with low voltage than compared to prior arts. When applying the same voltage as with conventional arts, an ink jet recording head having better piezoelectric property with a greater displacement can be provided in comparison with prior arts.

When applying low voltage (4V–15V) between the lower electrode 32 and the upper electrode 42 of the piezoelectric device 40, a large displacement arises with the piezoelectric device 40. When this displacement causes the vibrating plate 30 to deform, the pressure inside the cavity 21 rises. Ink is filled in the cavity, so an instantaneous increase in pressure causes ink to be pressed from the nozzle hole 11 and discharged as a liquid drop.

If no voltage is applied on the piezoelectric device 40, no displacement arises and the pressure inside the cavity 21 provided within the piezoelectric device does not change, so an ink drop is not discharged.

Manufacturing Method

Figure 4:
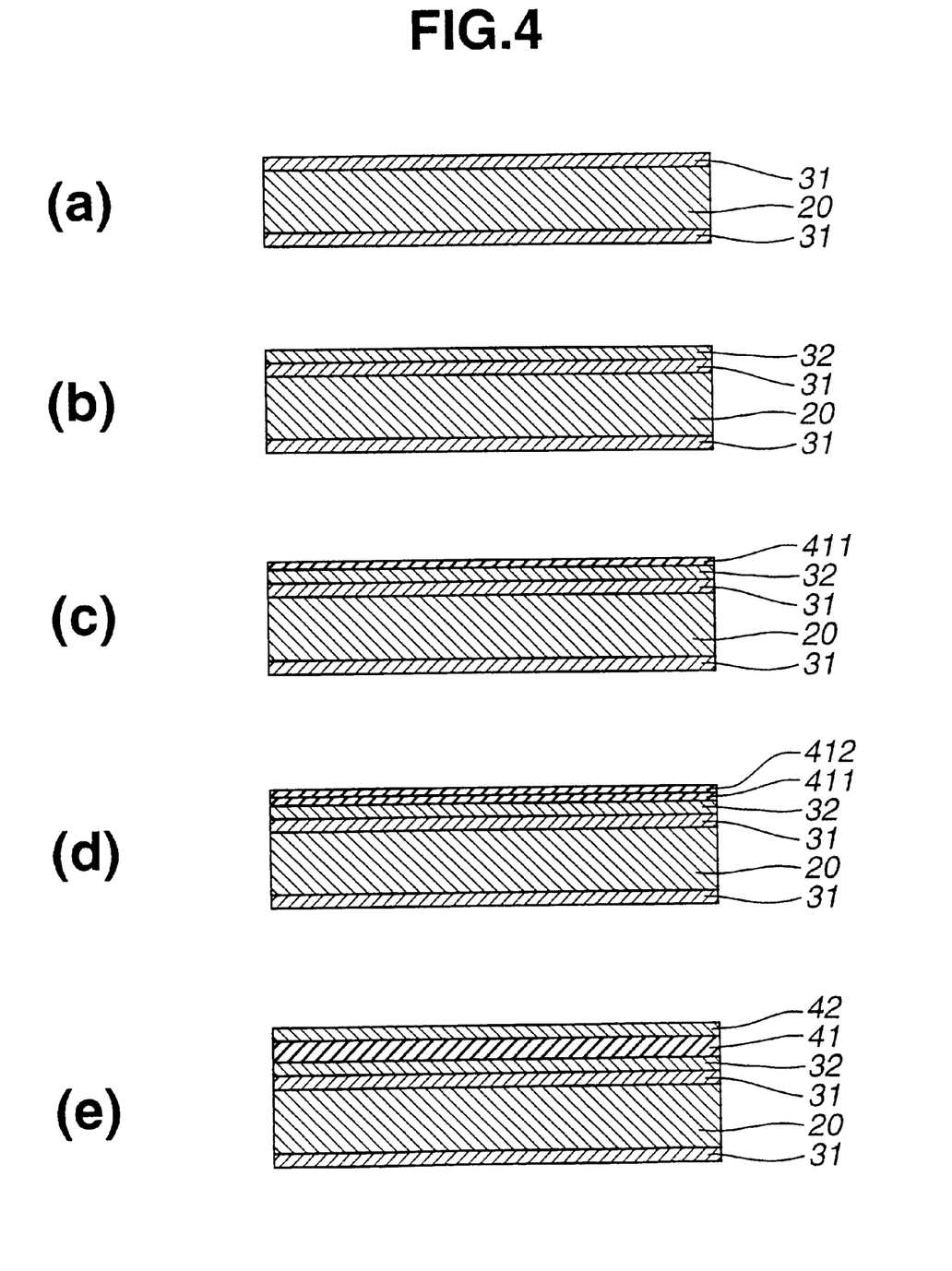
FIG. 4 is a cross section explaining the manufacturing steps for the ink jet recording head (piezoelectric device) according to the present invention.

Now, the manufacturing method of the piezoelectric device and ink jet recording head fulfilling the above conditions will be explained with reference to FIGS. 4 and 5.

Gel Manufacturing Step

During this step, a metal alkoxide solution which is the piezoelectric film gel is manufactured. Gels containing piezoelectric ceramics are, for example, acetic acid-based solutions or alcohol amine-based solutions. Although there are various methods for manufacturing the same, an example is described below.

Now, the step of preparing an acetic acid-based solution will be summarized. First, lead acetate hydrate (Pb ($CH_3COO)_2 \cdot 3H_2O$), zirconium acetyl acetonate (Zr($CH_3COCHCOCH_3)_4$) and magnesium acetate hydrate (Mg($CH_3COO)_2 \cdot 4H_2O$) are stirred with acetic acid as the solvent. In the initial stage, the mixture is stirred at room temperature, then stirred for 10 to 20 minutes in an atmosphere of approximately 100° C., then cooled at room temperature. Thereafter, titanium isopropoxide (Ti(O—i—$C_3H_7)_4$) and niobium pentaethoxide (Nb($OC_2H_5)_5$) is added and stirred. Butoxyethanol ($C_4H_9OC_2H_4OH$) is further added and stirred at room temperature for approximately 5 minutes. Thereafter, a 3%-ethanol doped hydrochloric acid is added and stirred at room temperature for approximately 5 minutes. Acetylacetone ($CH_3COCH_2COCH_3$) is added and stirred at room temperature for approximately 60 minutes. Lastly, polyethylene glycol (HO($C_2H_4)_nH$) is added and stirred at room temperature for approximately 5 minutes.

During the above process, it is important to manufacture the sol with the mol concentration of the piezoelectric ceramics material (solvent) adjusted between 0.7 mol/1 and 1.5 mol/1. If manufactured at a lower mol concentration than this range, the inclination of the crystal axis in the columnar grain with the (001) orientation will be insufficient. If manufactured at a higher mol concentration than this range, cracks, etc., are likely to arise. The content of the polyethylene glycol used as the solvent in 1 mol of the piezoelectric ceramics is approximately 0.15 mol or more to 0.5 mol or less. Cracks are likely to arise in cases where the mol concentration is lower than 0.15 mol, and if the mol concentration is larger than 0.5 mol, the inclination of the crystal axis in the columnar grain with the (001) orientation will be insufficient.

Now, the step of preparing an alcohol amine-based solution will be summarized below. First, butoxyethanol ($C_4H_9OC_2H_4OH$) is added to the solvents titanium isopropoxide (Ti(O—i—$C_3H_7)_4$) and niobium pentaethoxide (Nb($OC_2H_5)_5$), then stirred at room temperature for approximately 10 minutes. Diethanolamine is added further and stirred at room temperature for approximately 10 minutes. Then, lead acetate hydrate (Pb($CH_3COO)_2 \cdot 3H_2O$), zirconium acetyl acetonate (Zr($CH_3COCHCOCH_3)_4$) and magnesium acetate hydrate (Mg($CH_3COO)_2 \cdot 4H_2O$) are added and stirred. During the first half stage, the mixture is stirred at approximately 75° C. for approximately 30 minutes, and during the second half stage, the mixture is cooled at room temperature for approximately 30 minutes. Lastly, polyethylene glycol (HO($C_2H_4)_nH$) is added and stirred at room temperature for approximately 10 minutes. Concerning the mol concentration of the piezoelectric ceramics material and that of polyethylene glycol, the same applies as described for the acetic acid-based solution above. An alcohol amine-based solution is completed by the above steps.

Insulating Film Forming Step (FIG. 4(a)):

During this step, an insulating film 31 is formed on a silicon substrate 20 forming the base for the pressure chamber substrate. The silicon substrate 20 is, for example, 200 μm thick, and the insulating film 31 is formed with a thickness of approximately 1 μm. The insulating film is manufactured by using prior art heat oxidation methods or the like.

Lower Electrode Forming Step (FIG. 4(b)):

During this step, a lower electrode 32 is formed above the insulating film 31. The lower electrode 32 is formed for example by layering layers of titanium, titanium oxide, titanium, platinum, and titanium in order with respective thicknesses of 0.01 μm, 0.01 μm, 0.005 μm, 0.5 μm, 0.005 μm. These layers are manufactured by using prior art direct current sputtering methods, etc.

Piezoelectric Film Forming Step (FIGS. 4(c) and (d)):

During this step, the piezoelectric film 41 according to the present invention is formed on the upper electrode 32 by using said sol. Thin films are repeatedly formed to obtain the piezoelectric film 41 by layering a predetermined number of thin film layers.

The step of forming each of the thin layers will be described below. The gel prepared above is coated at a predetermined thickness. The coating thickness is preferably 100 nm or more and 250 nm or less. If the coating is not thick enough, the number of processing required for the layering will become too large and there will be no throughput. If the coating is too thick, the finished piezoelectric film will become too thick and cause cracks, etc., during the manufacturing process.

For example, when using a prior art spin coating method, the coating is performed for 10 secs at 500 revolutions per minute, 30 secs at 1500 revolutions per minute, and 10 secs at 500 revolutions per minute. After the coating, the film is dried at a certain temperature (for example, 180° C.) for a certain time period (for example, approximately 10 minutes). Due to this drying process, moisture and small organic particles with small mass evaporate. After drying, the film is defatted under ambient atmospheric conditions at a predetermined high temperature (for example, 400° C.) for a certain time period (30 minutes). The defatting process causes organic ligands configured with the metal to be thermally decomposed, and the metal is oxidized to form a thin metal oxide layer 411 (FIG. 4(c)). These steps of coating→drying→defatting are repeated for a predetermined number of times, for example 4 times, and 4 thin layers 411–414 are layered (FIG. 4(d)).

After layering 4 layers of alcohol amine-based solution, in order to further enhance crystallization of the piezoelectric film and improve the piezoelectric properties, rapid thermal annealing process (RTA) is performed in a predetermined atmosphere. For example, after layering 4 layers, the film is heated in oxygen atmosphere at 650° C. for 5 minutes, and further at 900° C. for 1 minute. This RTA forms the perovskite crystal structure, but the stress arising therefrom causes the crystal axis of the (001) orientation to slightly incline toward the normal direction of the lower electrode.

The layering of these thin layers and the RTA are repeated. When for example 8 thin layers are layered, the RTA is performed after forming the 4th and 8th thin layers. The temperature conditions are changed with the RTA of the 8th layer, heating the film for 5 minutes at 650 degrees and for 1 minute at 900 degrees.

Upper Electrode Forming Step (FIG. 4(e)):

During this step, an upper electrode 42 is formed above the piezoelectric film 41. The material for the upper electrode may be platinum (Pt) or the like, and techniques such as the electron beam deposition method or sputtering method may be used for forming such electrode. The thickness is approximately 100 nm.

Etching Step (FIG. 5(a)):

During this step, a layered structure (411–41n) is masked on the vibrating plate film 30 (31, 32 ) to conform to the shape of each cavity 21, and the surroundings thereof are etched. Before etching, resist material is coated on the upper electrode 42 at a constant thickness by using the spinner method or spray method, etc. Thereafter, a mask is formed to the shape of the piezoelectric device, and then exposed to light and developed, leaving the resist at the shape of the piezoelectric device. For the etching, a normally used wet etching or dry etching method is used. By etching the upper electrode with the remaining resist, the upper electrode and piezoelectric film other than the area forming the piezoelectric device is removed to form the piezoelectric device 40.

Figure 5:
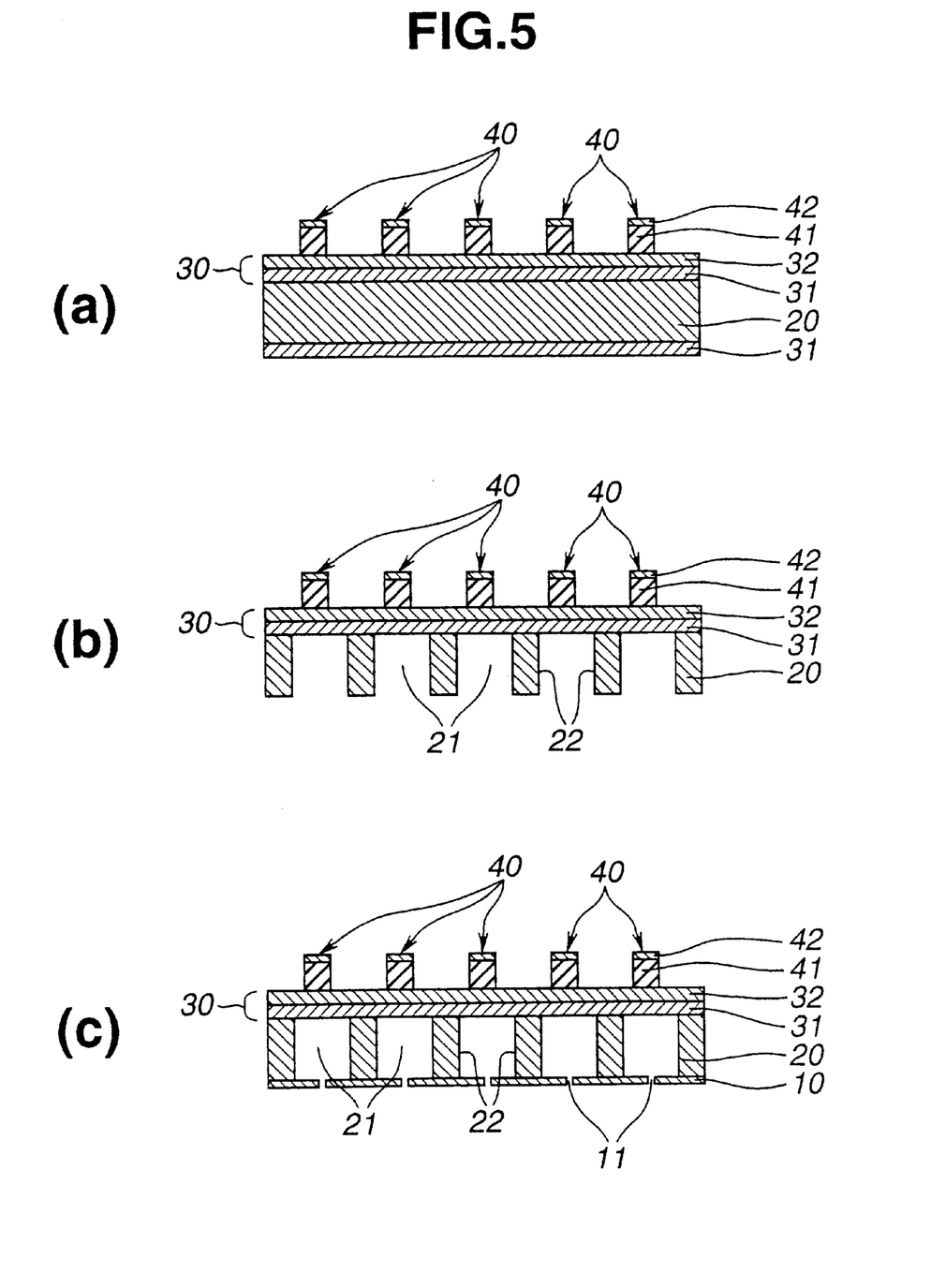
FIG. 5 is a cross section explaining the manufacturing steps for the ink jet recording head according to the present invention.

Pressure Chamber Forming Step (FIG. 5(*b*)):

During this step, a cavity is formed in the pressure chamber substrate. The cavity 21 is formed by etching. Anisotropic etching, parallel plate-type reactive ion etching and other anisotropic etching methods using activated gas are used for etching the other face of the pressure chamber substrate 20 having the piezoelectric device 40 formed thereon. The etched portion with the substrate material removed therefrom forms the cavity 21, and the non-etched, remaining portion forms the side wall 22.

Nozzle Plate Pasting Step (FIG. 5(*c*)):

During this step, the nozzle plate is pasted on the pressure chamber substrate 20. The adhesive agent for pasting the nozzle plate 10 may be resin or the like. The nozzle plate 10 is positioned so each nozzle hole 11 is arranged corresponding to the spaces of each cavity 21 during the pasting. The pressure chamber substrate 20 with the nozzle plate 10 pasted thereon is mounted on the box-shaped body 25 (cf. FIG. 2), thereby completing the ink jet recording head 1. As an alternative to pasting the nozzle plate 10, the pressure chamber substrate and the nozzle plate may be formed integrally. This means that a single silicon substrate is etched to the shape of a cavity, thereby simultaneously forming the member corresponding to the nozzle plate and the pressure chamber substrate. After etching, nozzle holes are formed in the portion corresponding to the nozzle plate. By these steps, the ink jet recording head can be manufactured without pasting the nozzle plate.

As described above, the present embodiment is structured so the crystal axis of the columnar grain with the (001) orientation is inclined at a certain angle from the-normal direction of the lower electrode, so the piezoelectric device formed by this piezoelectric film provides a higher piezoelectric performance in comparison to the prior art under a low drive voltage, and shows a high electric/mechanic converting function.

Other Variations

The present invention may be varied in many ways without being limited to the embodiments described above. For example, the piezoelectric device according to the present invention may be manufactured by other methods as long as the same conditions of the crystal axis above is fulfilled. As long as the majority of the crystal grains with the (001) orientation form a certain direction relative to the electric field, a piezoelectric device and ink jet recording head having high piezoelectric properties at low voltage can be provided.

Apart from the ink jet recording head described above, the piezoelectric device according to the present invention may be used for manufacturing a ferroelectric device such as a nonvolatile semiconductor storage, thin film condenser, pyro-electric detector, sensor, surface acoustic wave optical waveguide, optical storage, spatial light modulator and frequency doubler used with a diode laser, and also for manufacturing a dielectric device, pyro-electric device, piezoelectric device, and an electro-optical device. In other words, the piezoelectric device according to the present invention provides high piezoelectric properties with low voltage, thereby being suitable for devices requiring large displacement or portable devices with low source voltage.

Embodiments

As the manufacture method of the PZT device according to the present invention by using an alcohol amine-based solution has been described above, the properties of the manufactured device will be described below. As a prior art, a PZT manufactured by using the same alcohol amine-based solution with the mol concentration of the piezoelectric ceramics solvent being 0.7 mol % is described.

Figure 7:
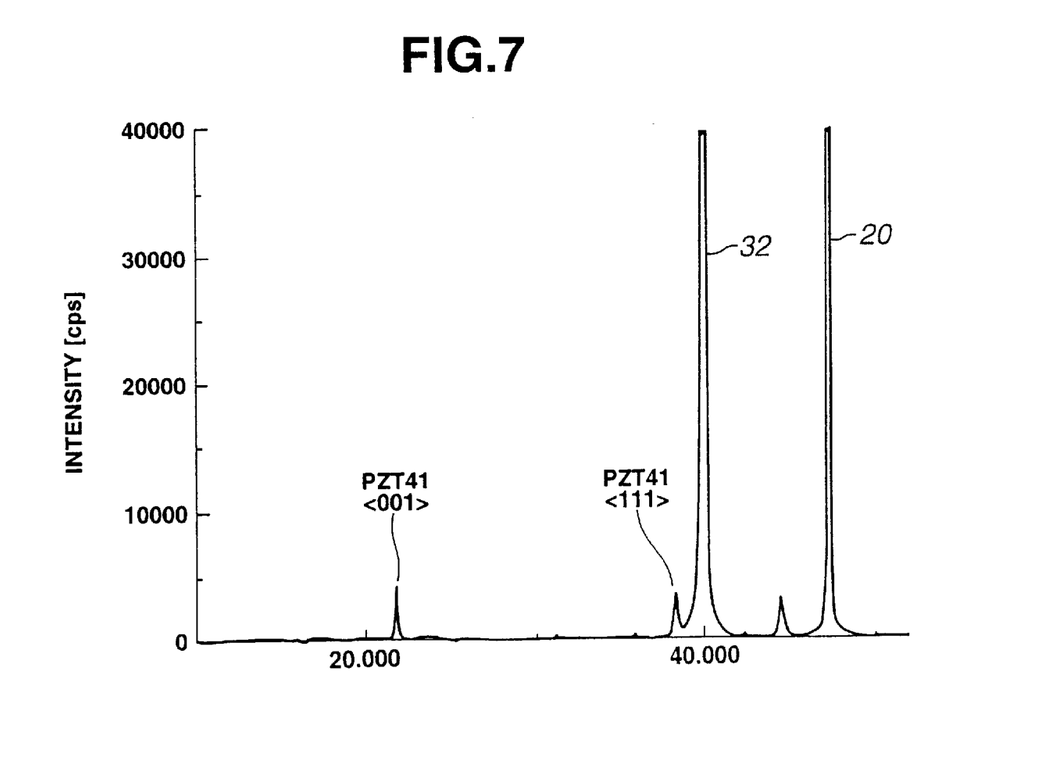
FIG. 7 shows the X-ray diffraction spectrum in a piezoelectric device according to the present invention.

FIG. 7 shows the X-ray spectrum of the piezoelectric device according to the present invention, as measured by X-ray diffraction. It is clear from this figure that the piezoelectric film 41 is mostly made of crystals with the (111) orientation and the (001) orientation. The movements of the columnar grains having these crystal axes determine the voltage-dependency of the piezoelectric device.

Figure 8:
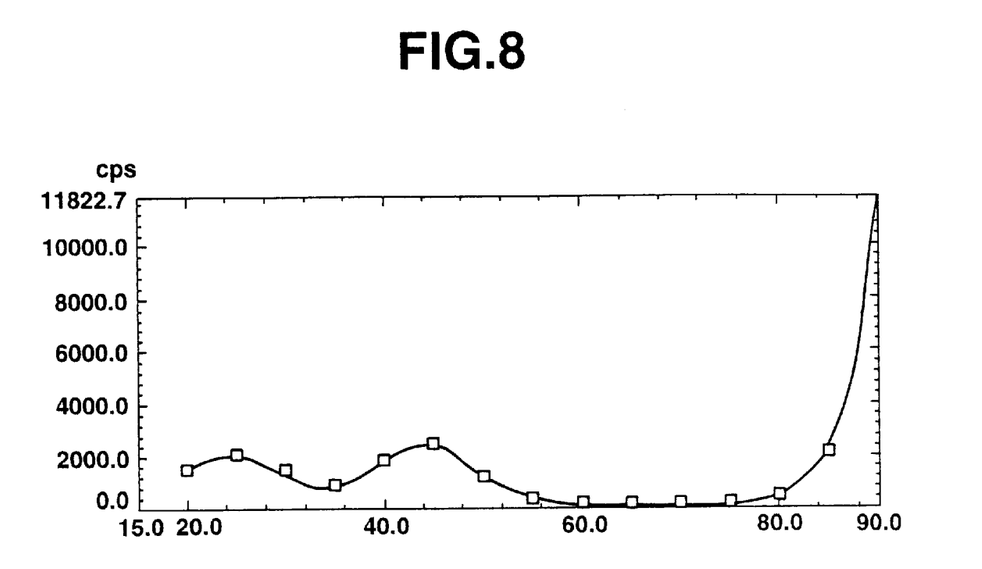
FIG. 8 is a pole plot, and is a characteristic view explaining the angle formed by the crystallographic axis of the columnar grain with the (111) orientation in the piezoelectric device of one embodiment, and the normal direction of the lower electrode face.
Figure 9:
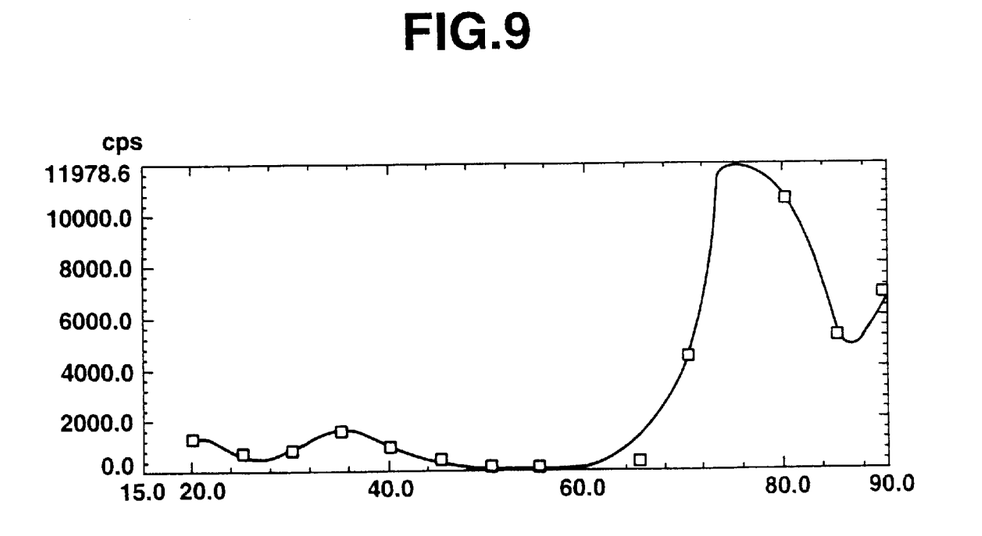
FIG. 9 is a pole plot, and is a characteristic view explaining the angle formed by the crystallographic axis of the columnar grain with the (001) orientation in the piezoelectric device of one embodiment, and the normal direction of the lower electrode face.

FIG. 8 shows the -crystal axis of the columnar grain with the (111) orientation in the piezoelectric device according to the present invention by the angle formed with the normal direction of the lower electrode surface. FIG. 9 shows the crystal axis of the columnar grain along the (001) orientation in the piezoelectric device according to the present invention by the angle formed with the normal direction of the lower electrode surface. Both figures have been measured by the pole figure. The x-axis shows the angle between the normal direction of the lower electrode face and the crystal axis, and the y-axis shows the count number of the reflected x-rays, namely the rate of existence of the crystal structure. FIG. 8 shows that most of the crystal axes in the columnar grain with the (111) orientation are parallel to the normal direction of the lower electrode face, namely parallel to the direction of the electric field. This is the same as the crystal axis along the (111) orientation in a conventional piezoelectric device. It is clear that the crystal axis does not change in the crystal grain with the (111) orientation. As shown in FIG. 9, the majority of the crystal axes in the columnar grain with the (001) orientation are inclined by approximately 5 to 20 degrees from the normal direction of the lower electrode face. In other words, it has been confirmed that the polarization axis is inclined by a certain angle relative to the direction of the electric field.

Figure 10:
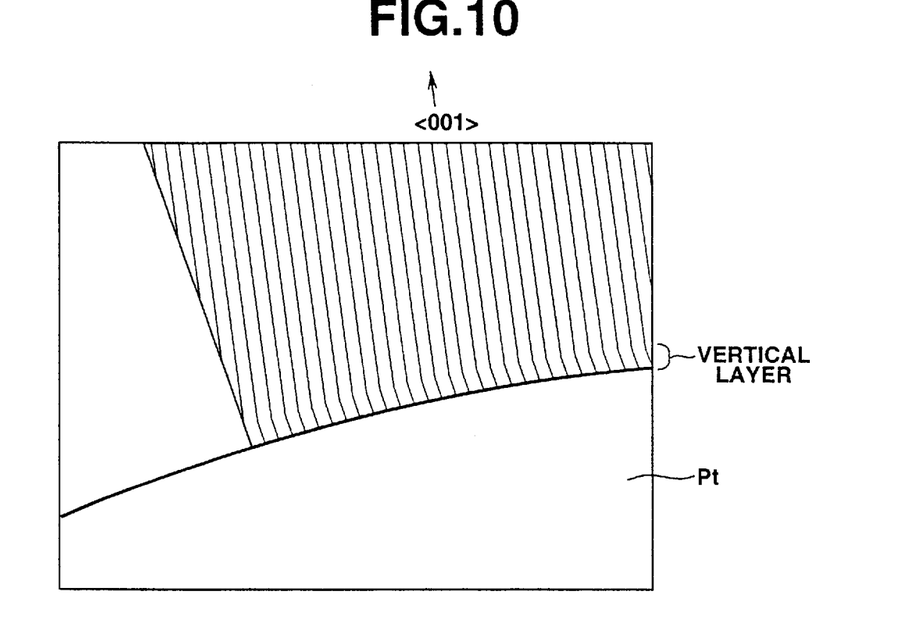
FIG. 10 is a model view (vertical layer) of a cross-sectional transmission electron microscopy (XTEM) photograph in the vicinity of the interface between the lower electrode and the piezoelectric film.
Figure 11:
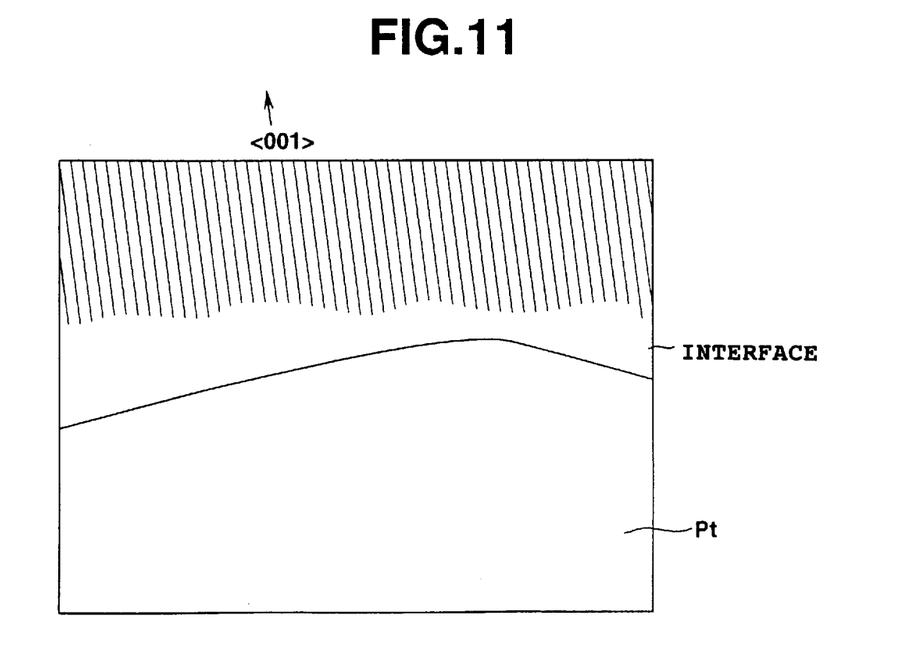
FIG. 11 is a model view (interface layer whose dielectric constant is low) of an XTEM photograph in the vicinity of the interface between the lower electrode and the piezoelectric film.

FIGS. 10 and 11 are model views of an XTEM photograph of the vicinity of the interface between the lower electrode and the piezoelectric film in the piezoelectric device according to the present invention. In FIG. 10, the crystal axis (polarization axis) in the vicinity of the interface with the lower electrode Pt has a perpendicular portion, but above this portion, an inclined portion can be seen. A perpendicular layer can be confirmed. In FIG. 11, there is a lattice defect in the vicinity of the interface with the lower electrode Pt, and the crystal structure is unclear. This portion has many lattice defects preventing a well-ordered crystal structure, so the layer has a low dielectric constant. A layer having a low dielectric constant can be confirmed.

Table 1 shows, concerning the columnar crystal with the (001) orientation in the piezoelectric device according to the present invention, the relation between the inclination of the crystal axis measured based on the plane-view TEM microphotograph of the dark field image from diffraction beams, and the confirmed number N and the mean diameter D of the crystal grains.

TABLE 1

| Angle [°] | 0 | 4 | 6 | 8 | 12 | 16 | 18 | 20 |
|---|---|---|---|---|---|---|---|---|
| N (pieces) | 2 | 6 | 8 | 4 | 9 | 7 | 2 | 2 |
| D [nm] | 120 | 160 | 140 | 150 | 100 | 130 | 120 | 120 |

As can be seen from Table 1, the crystal grains in the columnar grain with the (001) orientation is mostly seen in the range of 5 to 15 degrees. It can also be seen that in this range, the average grain diameter is larger compared to the average grain diameter of 120 nm of the crystal grain in the columnar grain with the (111) orientation. This supports the analysis results in FIG. 9.

Figure 12:
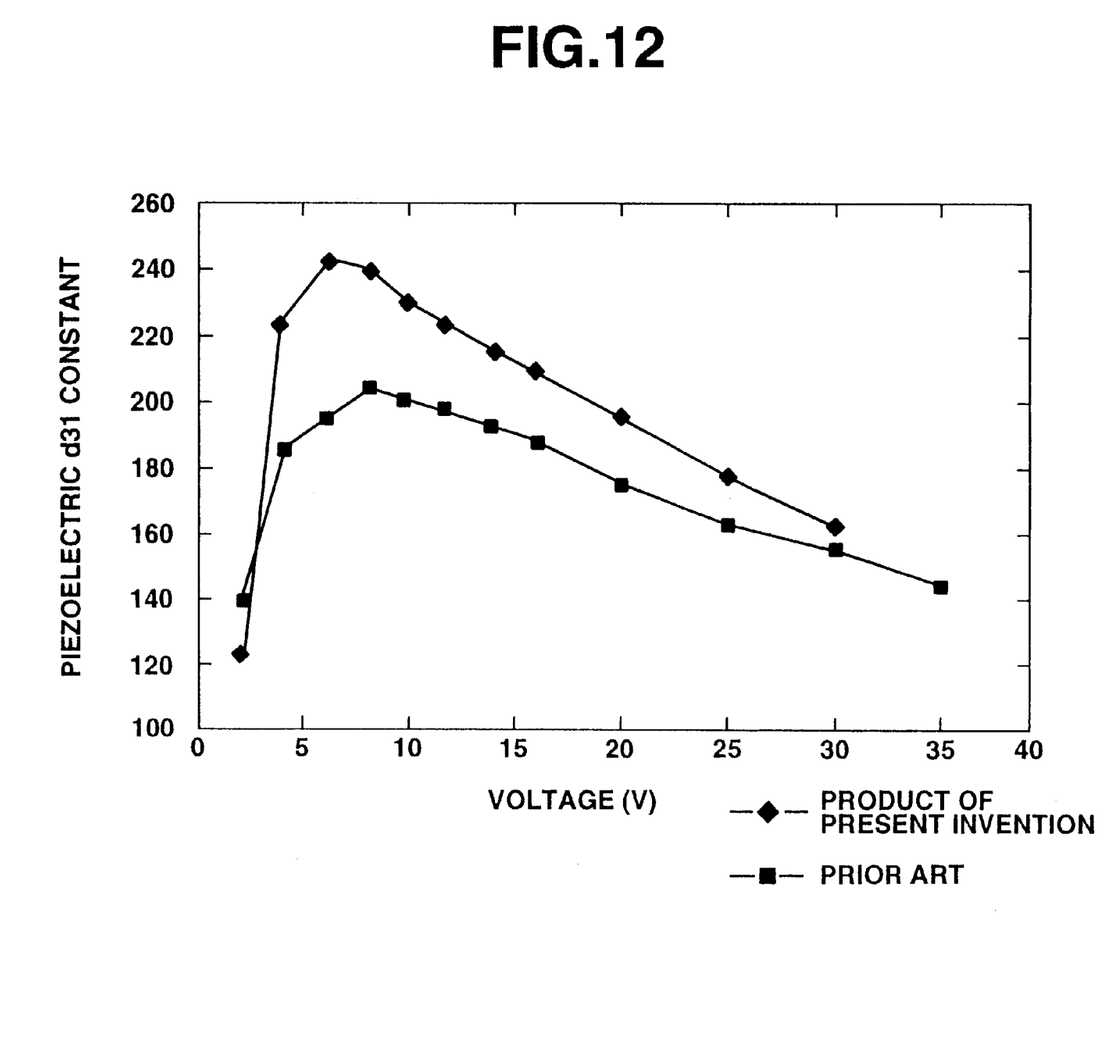
FIG. 12 illustrates the voltage-dependency of the piezoelectric charge constant d of a piezoelectric device according to the present invention and that of a prior art.

FIG. 12 shows the measurement of the voltage-dependency of the piezoelectric charge constant d, which is a barometer showing the electric/mechanic converting function of the piezoelectric device. In other words, the piezoelectric charge constant d of the piezoelectric device was measured by increasing the voltage applied to the piezoelectric device. As can be seen from FIG. 12, under the applied voltage of approximately 5V–7V, the piezoelectric device according to the present invention reaches the maximum value of the conventional piezoelectric device, and shows a higher piezoelectric charge constant d than the prior art in a wide range of between 4V–17V. This means that the same level of piezoelectric property as the prior art can be obtained with lower drive voltage than the prior art. Thereby, the piezoelectric device according to the present invention is suitable for low voltage drive, and it was confirmed that there is a high displacement as long as the drive voltage is set within this range. Therefore, an ink jet recording head using this piezoelectric device can discharge the same amount of ink as the prior art with a lower drive voltage than the prior art, and furthermore, can discharge more ink than the prior art within a certain drive voltage range.

As the piezoelectric device according to the present invention is formed so the crystal axis of the crystal grain with the (001) orientation is inclined by a certain angle relative to the normal direction of the lower electrode face, it is possible to provide an ink jet recording head which can discharge ink well at low voltage. Also, within a certain voltage range, it is possible to provide an ink jet recording head with higher discharging properties than the prior art.

According to the method of manufacturing a piezoelectric device of the present invention, it is possible to adjust the mol concentration of the solvent and thereby adjust the crystal axis of the crystal grain in the (001) orientation.

According to the method of manufacturing a piezoelectric device relating to the present invention, by adjusting the mol concentration of the solvent, it is possible to manufacture an ink jet recording head having a high performance piezoelectric device with an adjusted crystal axis of the crystal grain at the (001) orientation.

What is claimed is:

1. A piezoelectric device comprising:
    a lower electrode;
    an upper electrode; and
    a crystallized piezoelectric film arranged between said lower electrode and said upper electrode, said crystallized piezoelectric film including crystal with a crystal axis of a columnar grain with a (001)orientation,
    wherein the crystal axis of the columnar grain with the (001) orientation of the crystal forming said piezoelectric film is inclined relative to a normal direction of an upper face of said lower electrode.

2. A piezoelectric device according to claim 1, wherein said crystal axis is inclined relative to the normal direction of said upper face of said lower electrode by an angle within the range of 5 to 20 degrees.

3. A piezoelectric device according to claim 1, wherein said columnar grain with the (001) orientation includes an interface layer within the range of 5 nm or less from said upper face of said lower electrode.

4. A piezoelectric device according to claim 1, wherein said columnar grain with the (001) orientation is parallel to the normal direction of said upper face of said lower electrode within the range of 15 nm or less from said upper face of said lower electrode.

5. A piezoelectric device according to claim 1, wherein said piezoelectric film includes a crystal with a crystal axis of columnar grain with a (111) orientation, wherein said crystal is substantially parallel to the normal direction of said upper face of said lower electrode.

6. A piezoelectric device according to claim 5, wherein said columnar grain with the (001) orientation comprises a crystal grain with larger average grain diameter than the columnar grain with the (111) orientation.

7. A piezoelectric device according to claim 1, wherein said piezoelectric film comprises piezoelectric ceramics selected from the group consisting of lead zirconate titanate ($Pb(Zr,Ti)O_3$:PZT), lanthanum lead titanate (($Pb,La)TiO_3$), lead lanthanum zirconate titanate (($Pb,La)(Zr,Ti)O_3$:PLZT), or lead magnesium niobate zirconate titanate ($Pb(Zr,Ti)(Mg,Nb)O_3$:PZT-PMN).

8. An ink jet recording head comprising:
    a pressure chamber provided on a pressure chamber substrate; and
    a nozzle provided in said pressure chamber,
    wherein ink can be discharged from said nozzle by changing the volume of said pressure chamber,
    and volume change is caused in said pressure chamber by using the piezoelectric device according to any one of claims 1 to 3 and 4 to 7.

* * * * *

UNITED STATES PATENT AND TRADEMARK OFFICE
CERTIFICATE OF CORRECTION

PATENT NO.    : 6,411,017 B1
DATED         : June 25, 2002
INVENTOR(S)   : Qiu, Sumi et al.

It is certified that error appears in the above-identified patent and that said Letters Patent is hereby corrected as shown below:

<u>Title page,</u>
Item [75], Inventors, please correct inventor name: delete "Nishikawa" and insert -- Nishiwaki --;

<u>Column 1,</u>
Line 55, delete "Ser." and insert -- Patent --;

<u>Column 5,</u>
Line 1, delete "5m" and insert -- 5nm --;
Line 59, delete "operatable" and insert -- operable --;

<u>Column 6,</u>
Line 11, delete "ate" and insert -- are --;
Line 16, delete "ink." and insert -- ink --;

<u>Column 7,</u>
Lines 7-8, delete "(Ti(O—i—$C_3H_7)_4$)" and insert -- (Ti(O-i-$C_3H_7)_4$) --;
Line 35, delete "(Ti(O—i—$C_3H_7)_4$)" and insert -- (Ti(O-i-$C_3H_7)_4$) --;

<u>Column 9,</u>
Line 33, delete "the-normal" and insert -- the normal --; and

<u>Column 10,</u>
Line 12, delete "-crystal" and insert -- crystal --.

Signed and Sealed this

Thirty-first Day of December, 2002

JAMES E. ROGAN
*Director of the United States Patent and Trademark Office*